United States Patent [19]

Fimoff et al.

[11] Patent Number: 5,677,911
[45] Date of Patent: Oct. 14, 1997

[54] DATA FRAME FORMAT FOR A DIGITAL SIGNAL HAVING MULTIPLE DATA CONSTELLATIONS

[75] Inventors: Mark Fimoff, Hoffman Estates; Timothy G. Laud, Mundelein, both of Ill.

[73] Assignee: Zenith Electronics Corporation, Glenview, Ill.

[21] Appl. No.: 417,581

[22] Filed: Apr. 6, 1995

Related U.S. Application Data

[63] Continuation-in-part of Ser. No. 175,061, Dec. 29, 1993, abandoned.

[51] Int. Cl.[6] .......................... H03M 13/00; H03M 13/22
[52] U.S. Cl. ............................................................. 371/2.1
[58] Field of Search .................................. 371/37.1, 2.1; 375/264

[56] References Cited

U.S. PATENT DOCUMENTS

| | | | |
|---|---|---|---|
| 4,447,902 | 5/1984 | Wilkinson | 371/39 |
| 4,760,576 | 7/1988 | Sako | 371/40 |
| 4,800,550 | 1/1989 | Yamauchi | 369/59 |
| 4,937,844 | 6/1990 | Kao | 375/122 |
| 5,056,112 | 10/1991 | Wei | 375/53 |
| 5,087,975 | 2/1992 | Citta et al. | 358/183 |
| 5,113,401 | 5/1992 | Chevillat et al. | 371/43 |
| 5,170,400 | 12/1992 | Dotson | 371/37.4 |
| 5,321,725 | 6/1994 | Paik et al. | 375/39 |
| 5,475,691 | 12/1995 | Chapman et al. | 370/110.4 |
| 5,541,955 | 7/1996 | Jacobsmeyer | 375/222 |

FOREIGN PATENT DOCUMENTS

| | | |
|---|---|---|
| 0050082 | 4/1982 | European Pat. Off. . |
| 9222162 | 12/1992 | WIPO . |
| 9314588 | 7/1993 | WIPO . |

OTHER PUBLICATIONS

Electronics and Communication Engineering Journal, vol. 4, No. 4, Aug. 1992, pp. 167–176, Webb, "QAM: The Modulation Scheme for Future Mobile Radio Communications?".

*Primary Examiner*—Stephen M. Baker

[57] ABSTRACT

A data frame structure for a digital information signal comprises a first fixed number of repetitive data segments each containing a second fixed number of M-level symbols representing a plurality of data bytes and a data segment sync character. The frame further includes a header segment including a frame sync code and a mode code defining the value of M for the data frame. The data frame incorporates error correction blocks and is configured to provide an integral number of data bytes and error correction blocks for each of a plurality of different values of M.

30 Claims, 10 Drawing Sheets

| VSB MODE M | DATA SYMBOLS PER FRAME | BITS PER SYMBOL | DATA BYTES PER FRAME | RS BLOCKS PER FRAME | INTERLEAVE GROUPS PER FRAME (B=26) | INTERLEAVE GROUPS PER FRAME (B=52) |
|---|---|---|---|---|---|---|
| 24 | 258,336 | 4.5 | 145,314 | 702 | 5589 | — |
| 16 | 258,336 | 4 | 129,168 | 624 | 4968 | 2484 |
| 8 | 258,336 | 3 | 96,876 | 468 | 3726 | 1863 |
| 4 | 258,336 | 2 | 64,584 | 312 | 2484 | 1242 |
| 2 | 258,336 | 1 | 32,292 | 156 | 1242 | 621 |

| VSB MODE M=16 | VSB MODE M=8 | VSB MODE M=4 | VSB MODE M=2 |
|---|---|---|---|
| 1111 +120 | | | |
| | 111 +112 | | |
| 1110 +104 | | | |
| | | 11 +96 | |
| 1101 +88 | | | |
| | 110 +80 | | |
| 1100 +72 | | | |
| | | | 1 +64 |
| 1011 +56 | | | |
| | 101 +48 | | |
| 1010 +40 | | | |
| | | 10 +32 | |
| 1001 +24 | | | |
| | 100 +16 | | |
| 1000 +8 | | | |
| 0111 −8 | | | |
| | 011 −16 | | |
| 0110 −24 | | | |
| | | 01 −32 | |
| 0101 −40 | | | |
| | 010 −48 | | |
| 0100 −56 | | | |
| | | | 0 −64 |
| 0011 −72 | | | |
| | 001 −80 | | |
| 0010 −88 | | | |
| | | 00 −96 | |
| 0001 −104 | | | |
| | 000 −112 | | |
| 0000 −120 | | | |

| 0 | 5101 | – | – | – | – | – | – | – | – | – | – | 1 |
| 1 | 5102 | – | – | – | – | – | – | – | – | – | – | 2 |
| 2 | 5103 | – | – | – | – | – | – | – | – | – | – | 3 |
| , | , | | | | | | | | | | | , |
| , | , | | | | | | | | | | | , |
| , | , | | | | | | | | | | | , |
| , | , | | | | | | | | | | | , |
| , | , | | | | | | | | | | | , |
| , | , | | | | | | | | | | | , |
| , | , | | | | | | | | | | | , |
| , | , | | | | | | | | | | | , |
| , | , | | | | | | | | | | | , |
| , | , | | | | | | | | | | | 5304 |
| 5304 | , | | | | | | | | | | | 0 |

| 12 | 1 | 5 | 11 |
|----|----|----|----|
| 11 | 0 | 4 | 10 |
| 10 | 12 | 3 | 9 |
| 9 | 11 | 2 | 8 |
| 8 | 10 | 1 | 7 |
| 7 | 9 | 0 | 6 |
| 6 | 8 | 12 | 5 |
| 5 | 7 | 11 | 4 |
| 4 | 6 | 10 | 3 |
| 3 | 5 | 9 | 2 |
| 2 | 4 | 8 | 1 |
| 1 | 3 | 7 | 0 |
| 0 | 2 | 6 | 12 |

DATA FRAME FORMAT FOR A DIGITAL SIGNAL HAVING MULTIPLE DATA CONSTELLATIONS

This application is a continuation-in-part of application Ser. No. 08/175,061, filed Dec. 29, 1993, abandoned.

CROSS REFERENCE TO RELATED APPLICATIONS

This application discloses subject matter claimed in copending application Ser. No. 175,014, entitled DIGITAL TRANSMISSION SYSTEM WITH DATA RATE OPTIMIZED FOR NOISE IN TRANSMISSION MEDIUM; Ser. No. 175,085 entitled DATA SYSTEM HAVING 24 LEVEL SYMBOLS; Ser. No. 175,325, (which has been abandoned in favor of continuation-in-part application Ser. No. 315,153, filed Sep. 29, 1994) entitled CONVOLUTIONAL INTERLEAVER AND DEINTERLEAVER; and Ser. No., 175,070, entitled SYMBOL TO BYTE CONVERTER, all filed Dec. 29, 1993 and all assigned to Zenith Electronics Corporation.

BACKGROUND OF THE INVENTION AND PRIOR ART

This invention relates generally to digital transmission systems and particularly to a digital data transmission system having a data frame structure and circuit arrangement selected to facilitate operations such as symbol to byte conversion, interleaving and deinterleaving and forward error correction. The system also facilitates the use of a data rate that is related to the signal to noise ratio (S/N ratio) of the transmission environment for enhancing system capacity.

U.S. Pat. No. 5,087,975 discloses a vestigial sideband (VSB) system for transmitting a television signal in the form of successive M-level symbols over a standard 6 MHz television channel. The television signal may, for example, comprise one or two compressed wideband HDTV signals or a number of compressed lower resolution signals. While the number of levels M characterizing the symbols may vary depending on circumstances, the symbol rate is preferably fixed, such as at a rate of 684 H (about 10.76 Megasymbols/sec), where H is the NTSC horizontal scanning frequency. The number of symbol levels used in any particular situation is largely a function of the S/N ratio characterizing the transmission medium, a smaller number of symbol levels being used in situations where the S/N ratio is low. It is believed that the ability to accommodate symbol levels of 24, 16, 8, 4 and 2 provides adequate flexibility to satisfy conditions in most systems. It will be appreciated that lower values of M can provide improved S/N ratio performance at the expense of reduced transmission bit rate. For example, assuming a rate of 10.76M symbol/sec, a 2-level VSB signal (1 bit per symbol) provides a transmission bit rate of 10.76 Megabits/sec, a 4-level VSB signal (2 bits per symbol) provides a transmission bit rate of 21.52 Megabits/sec and so on up to a 24-level VSB signal which provides a transmission bit rate of about 48.43 Megabits/sec.

It is generally known that the S/N ratio performance of cable television plants decreases as the signal (channel) frequency increases. The foregoing attribute of an M-level VSB transmission system, i.e. improved S/N ratio performance as M decreases, is used in one aspect of the invention to compensate for the S/N ratio degradation in the higher frequency channels of CATV distribution plants. That is, according to this aspect of the invention, VSB transmission is effected in a CATV system wherein the lower frequency channels are transmitted using larger values of M. While the bit rate of the higher frequency channels is thereby reduced, the received signal may be reproduced with a S/N ratio comparable to that of the lower frequency channels.

Moreover, in accordance with other aspects of the invention, system efficiency, particularly in relation to receiver operations such as data interleaving and deinterleaving, symbol to byte conversion and forward error correction, may be greatly enhanced by selecting a data frame structure which facilitates these operations within the constraints of the variable M-level VSB character of the transmitted signal.

OBJECTS OF THE INVENTION

Accordingly, it is a principal object of this invention to provide a novel data format for digital data transmission.

Another object of this invention is to provide a novel data frame structure useful in the transmission of a digital information signal characterized by a data constellation which may assume any one of a plurality of different sizes.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
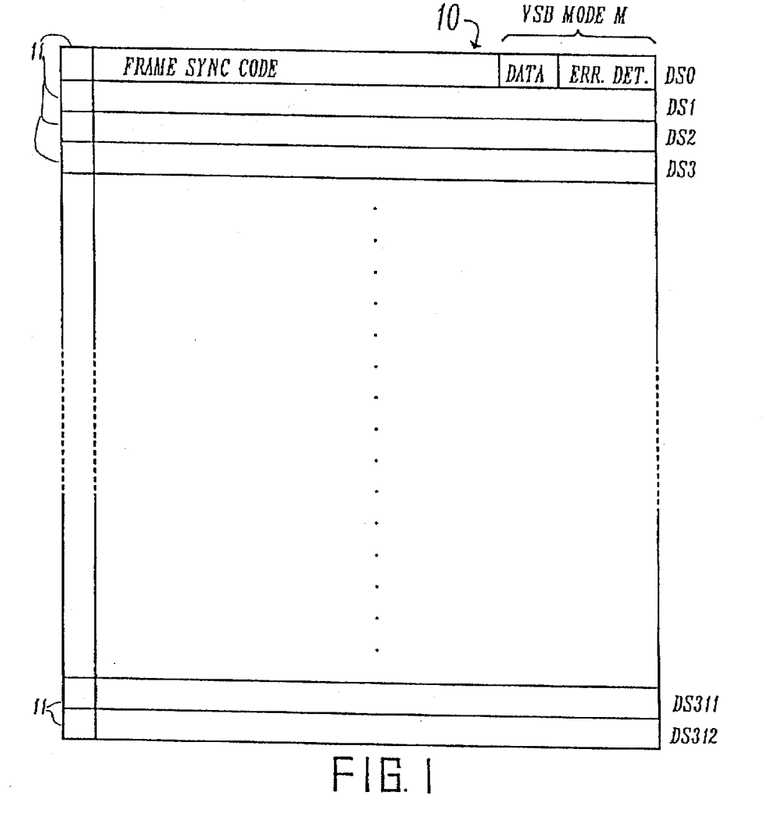
FIG. 1 illustrates the novel data frame structure of the invention.

The structure of the novel data frame of the invention is illustrated in FIG. 1. The data frame format is subject of this invention. The data frame, generally identified by reference numeral 10, comprises 313 data segments (DS) identified as DS0–DS312. Each data segment includes 828 symbols of data and 4 symbols defining a data segment sync character 11. Each data segment sync character 11 comprises four 2-level symbols which preferably assume the form disclosed in copending application Ser. No. 894,388. The first data segment DS0 comprises only 2-level symbols. These 2-level symbols represent a pseudo random sequence frame synchronization code, and an 8 symbol VSB mode, or control, signal that identifies the level M (e.g. 24, 16, 8, 4 or 2) of the symbols of the data field of the remaining 312 data segments of the data frame. The first three bits of the eight bit VSB mode control byte identify the VSB mode and the remaining 5 bits comprise parity bits which may be used by the receiver for error detection. In the previously mentioned CATV distribution system, for example, the VSB mode signal would identify a relatively large M for low frequency channels and a smaller M for higher frequency channels. In a terrestrial broadcast environment, the VSB mode would most likely be M=2, 4 or 8.

Figure 2:
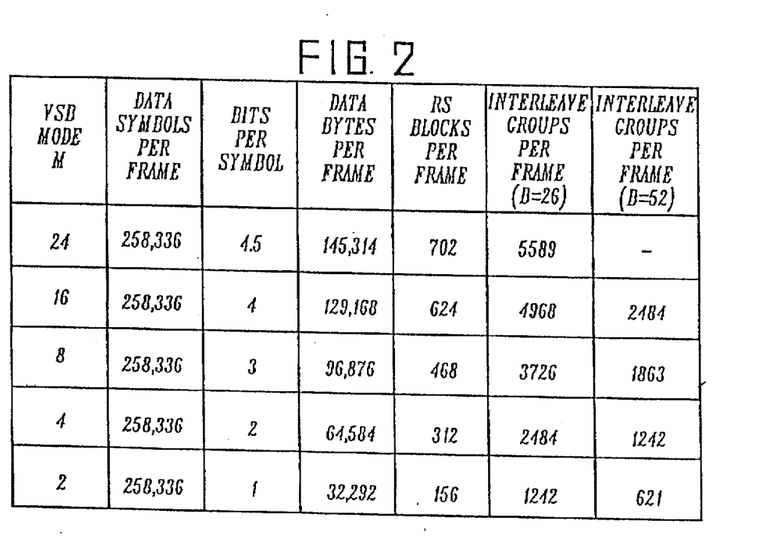
FIG. 2 is a chart showing the relationship of data constellation size to the other parameters of the invention.

Referring to the table of FIG. 2, each data symbol of a data segment DS1–DS312 represents either 4.5 bits (M=24), 4 bits (M=16), 3 bits (M=8), 2 bits (M=4), or 1 bit (M=2). Since there are a fixed number of data symbols per frame (312×828=258,336), the number of data bytes per frame will vary as shown. That is, each frame comprises 145,314 data bytes for VSB mode M=24; 129,168 data bytes for VSB mode M=16; 96,876 data bytes for VSB mode M=8; 64,584 data bytes for VSB mode M=4; and 32,292 data bytes for VSB mode M=2. However, while the number of data bytes per frame varies depending on the VSB mode M, it will be observed that for any particular value of M (24, 16, 8, 4 or 2), an integral number of bytes is provided in each frame. This characteristic of the structure of frame 10 substantially simplifies the design of a receiver such that frame synchronization will be effected at a rate corresponding to an integral number of data bytes regardless of the VSB mode (i.e. 24, 16, 8, 4 or 2 level symbols). As will be explained in further detail hereinafter, the receiver forward error correction circuitry, the receiver symbol to byte converter, and the receiver deinterleaver are preferably frame synchronized with the transmitted signal. The frame sync signal can be directly used for these purposes so long as there are an integral number of bytes, forward error correction blocks and interleave groups in each data frame for each of the VSB modes.

Reed-Solomon (RS) forward error correction is used in the receiver of the invention. A standard transport packet size of 188 bytes has been established by the MPEG (Motion Picture Experts Group) committee, which, due to the presence of the data segment sync character 11, may be reduced to 187 bytes by removing the MPEG sync byte. Adding 20 parity bytes to each such 187 byte transport packet results in an RS block size of 207 bytes, allowing for the correction of 10 byte errors per RS block. As seen in FIG. 2, an RS block size of 207 bytes advantageously results in an integral number of RS blocks per frame for all of the selected VSB modes, thereby allowing the receiver RS decoder to be synchronized by the frame sync signal. A convolutional interleave group size (B) is defined according to the invention as comprising 26 or 52 data bytes (other values may be used) which also results in an integral number of interleave groups per frame regardless of the selected VSB mode (except for M=24 and B=52) as shown in FIG. 2. This also allows the frame sync signal to be used to periodically synchronize the receiver deinterleaver, thereby simplifying its design.

In an alternate embodiment, the same advantages of the invention are achieved by configuring each data segment DS to comprise 832 data and 4 sync symbols, each transport packet to comprise 188 bytes (i.e. the transport packet includes the MPEG sync byte) and each RS block to comprise 208 bytes.

Figure 3:
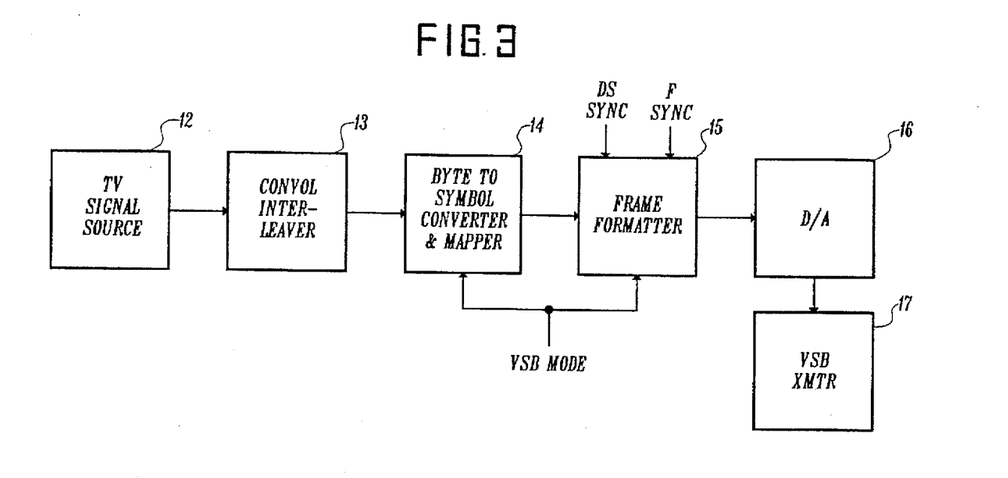
FIG. 3 is a simplified block diagram of a transmitter in accordance with the invention.

FIG. 3 is a simplified block diagram of a transmitter constructed in accordance with the invention. A source 12 of television signals is coupled to a convolutional interleaver 13 which, in turn, supplies interleaved data bytes to a byte to symbol converter and mapper 14. It will be appreciated that signal source 12 may comprise a compressed HDTV signal (or two compressed HDTV signals depending on the VSB mode) or a number of compressed NTSC signals. The symbol output of converter (and mapper) 14 is supplied to a frame formatter 15 that has inputs of data, data segment sync and frame sync and is controlled, along with converter 14, by a VSB mode control signal. The formatted frames, which conform to the arrangement previously described in connection with FIGS. 1 and 2, are supplied to a digital to analog (D/A) converter 16 and thence to a VSB transmitter 17 for transmission over a 6 MHz television channel. The transmission medium may comprise a cable television plant or a terrestrial broadcast environment. In either case, one such transmitter is required for each transmitted 6 MHz channel.

Figure 3A:
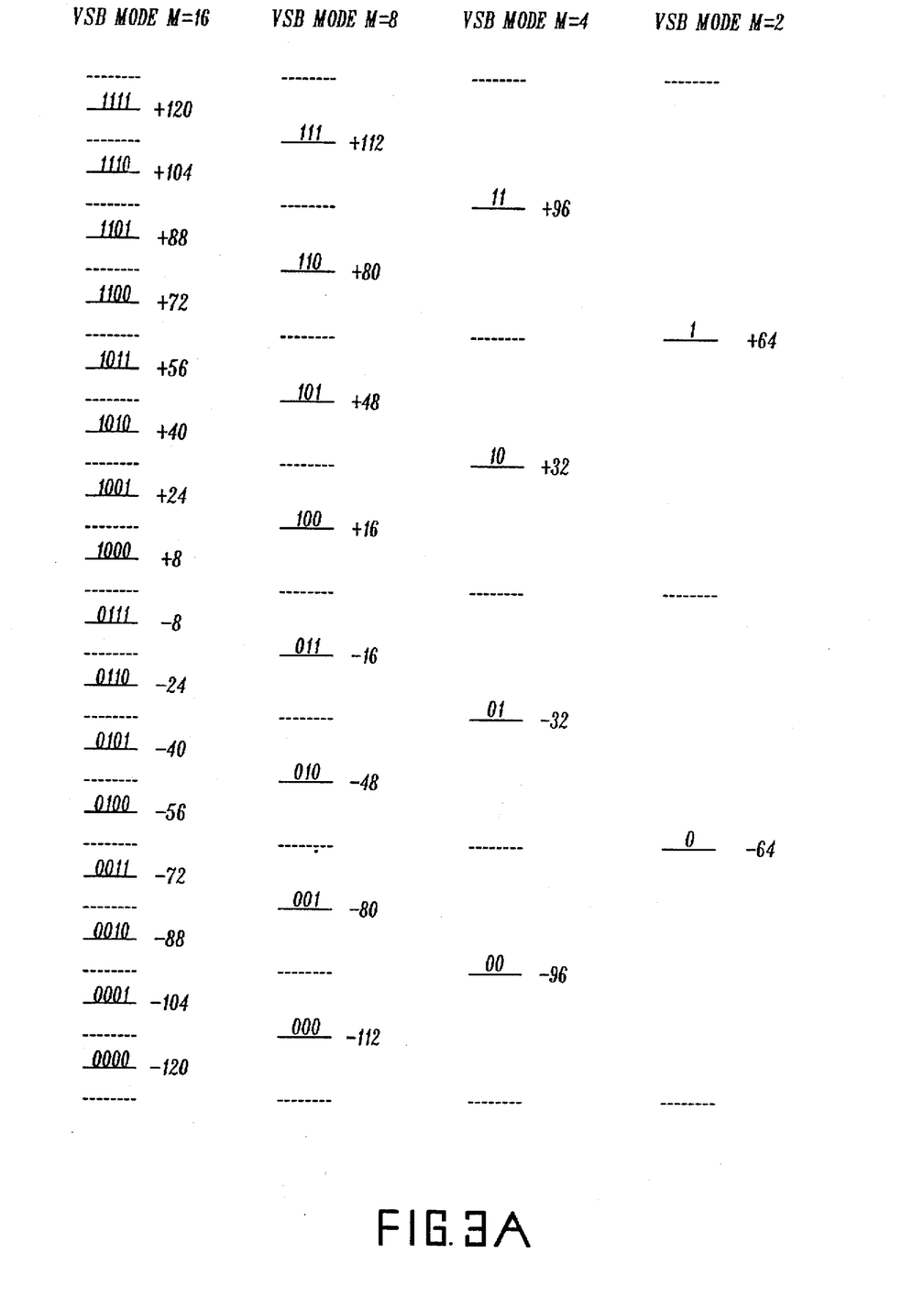
FIG. 3A is a chart illustrating an implementation of the byte to symbol converter in the transmitter of FIG. 3.

FIG. 3A is a chart illustrating a method of implementing the byte to symbol converter. The chart comprises four columns, one for each of the VSB modes M=16, M=8, M=4 and M=2. Converter 14 is operative in response to the applied VSB mode control signal for using the identified column of the chart of FIG. 3A for converting the input data bytes to output data symbols. For example, for VSB mode M=16, the input data byte 11010101 would be converted to two successive data symbols having relative amplitudes of +88 and −40. For VSB mode M=8, the input data byte would be converted to three successive data symbols having relative amplitudes of +80, +48 and −16 (assuming the first bit of the next data byte is 1) or +80, +48 and −48 (assuming the first bit of the next data byte is 0). For VSB mode M=4, the data byte would be converted to four successive symbols having relative amplitudes of +96, −32, −32 and −32. Finally, for VSB mode M=2, eight output symbols would be provided at relative amplitudes +64, +64, −64, +64, −64, +64, −64 and +64. In the case of VSB mode M=24, converter and mapper 14 includes appropriate memory and look-up tables for mapping successive groups of 9 input data bits into two successive 24 level output symbols. In this way each symbol can be referred to as representing 4.5 bits (i.e. 9 bits/2 symbols).

In connection with the foregoing, it will be observed that the relative levels of the symbols of each VSB mode are evenly spaced and lie midway between the relative levels of selected symbols of all higher VSB modes. For example, relative level +112 of VSB mode M=8 lies midway between relative levels +120 and +104 of VSB mode M=16, relative level +96 of VSB mode M=4 lies midway between relative levels +112 and +80 of VSB mode M=8 and midway between relative levels +104 and +88 of VSB mode M=16, relative level +64 of VSB mode M=2 lies midway between relative levels +96 and +32 of VSB mode M=4, +80 and +48 of VSB mode M=8 and +72 and +56 of VSB mode M=16, and so on. Preferably the symbol levels are offset from the values shown by a predetermined amount (e.g. +20) prior to transmission to provide a small pilot for facilitating carrier acquisition in the receiver. Also, it will be observed that the data rate characterizing each VSB mode increases by one bit per symbol relative to the data rate of the immediately lower VSB mode while its S/N ratio performance is reduced by one-half.

The above represents the situation in the version of the invention presently being implemented in chip form, in which 16 VSB is the highest mode. However, it will be apparent to those skilled in the art that the 24 VSB mode implementation will require different relative levels as taught by the invention. The technique and apparatus for processing a 24 VSB mode signal is discussed below and claimed in copending application Ser. No. 175,085 above.

Figure 3B:
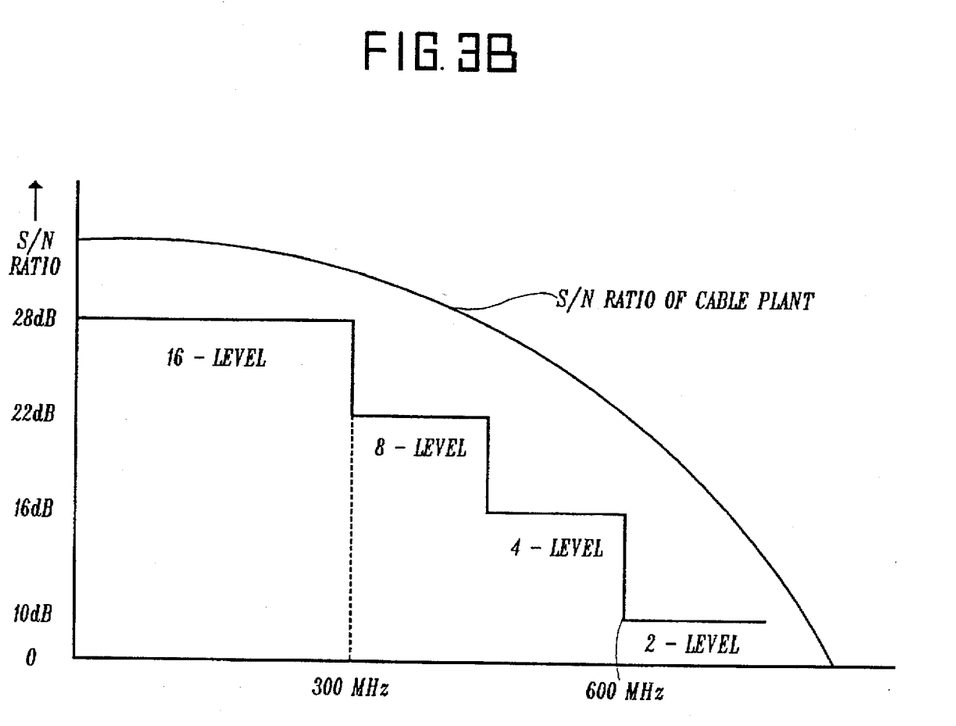
FIG. 3B is a chart illustrating the variation of S/N ratio with frequency in a cable plant and assignment of VSB mode for optimizing cable plant operation.

FIG. 3B illustrates the general S/N ratio fall off of a cable plant with increasing frequency. As is specified in the invention, the higher S/N ratio transmission characteristics for lower frequency television signals can be used to advantageously employ higher VSB transmissions (and a higher data rate) for similar performance. The "noisier" portion of the spectrum (low S/N ratio) may be used for signals of lower VSB modes. It will be apparent that this technique optimizes the utilization of the cable plant.

Figure 4:
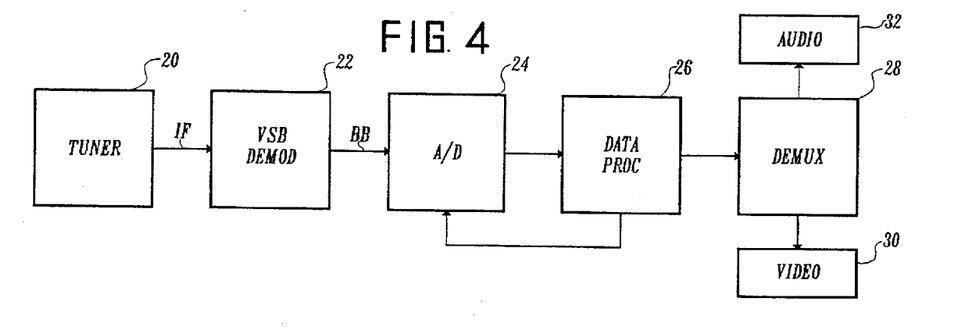
FIG. 4 is a simplified diagram of a receiver constructed in accordance with the invention.

FIG. 4 is a simplified block diagram of a receiver constructed according to the invention. The received RF television signal from the transmitter of FIG. 3 comprises an M-level VSB signal having the frame format of FIG. 1. The received signal is converted to an IF frequency by a tuner 20 and applied to a VSB demodulator 22. VSB demodulator 22 generates an analog baseband output signal comprising the M-level symbols at a rate of about 10.76 Megasymbols/sec. This analog signal is sampled by an analog to digital (A/D) converter 24 which converts the symbols to binary form and applies them to a data processor 26. Data processor 26 provides a feedback signal for controlling A/D 24 to insure that the analog baseband signal is sampled at the appropriate symbol times (see copending application Ser. No. 894,388). Data processor 26 applies the processed binary data, in the form of data bytes corresponding to the output of television source 12 in FIG. 3, to a demultiplexer 28, which distributes the received data to a video processor 30 and to an audio processor 32, each of which includes appropriate decompression circuitry.

Figure 5:
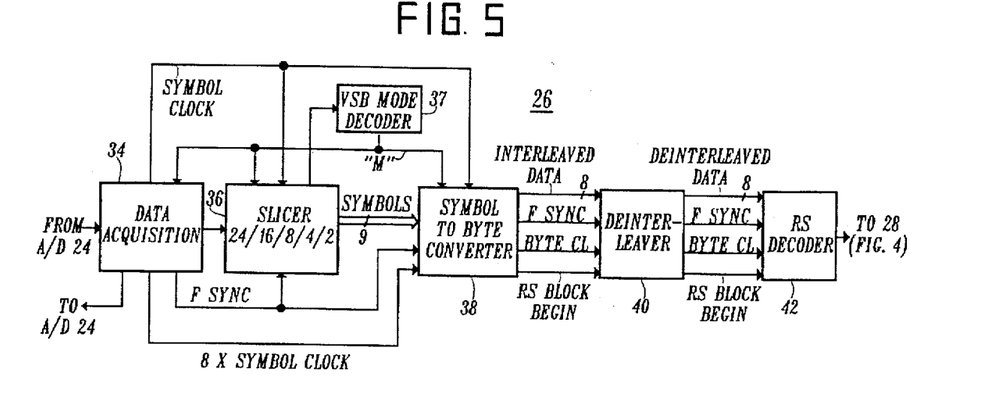
FIG. 5 is a more detailed showing of the data processor section of the receiver of FIG. 4.

Data processor 26 is shown in more detail in FIG. 5. The binary symbols from A/D are applied to a data acquisition circuit 34 which performs a number of functions including generating the feedback signal for controlling A/D 24, generating a symbol clock signal, generating a frame sync (FSYNC) signal and generating an 8 times symbol clock signal. The symbol clock signal has a frequency of about 10.76 MHz for all VSB modes except VSB mode M=24, in which case, as will be explained, its frequency is reduced by one-half to about 5.38 MHz. The FSYNC used in the preferred embodiment is approximately 41 Hz. The frame synchronization code of data segment DS0 enables derivation of the FSYNC signal which coincides in time with the first data symbol of data segment DS1 of each data frame 10.

The binary symbols from A/D 24 (representing the amplitudes of the sampled analog signal from VSB demodulator 22) are applied by data acquisition circuit 34 to a multilevel slicer 36 which converts the received symbols to bits according to the chart of FIG. 3A. As in the case of the transmitter, for VSB mode M=24, slicer 36 includes appropriate memory and look-up tables for mapping each successively received pair of symbols into 9 bits of output data. Slicer 36 couples the sliced values of the VSB mode control byte (eight 2-level symbols) of data segment DS0 of each frame to a VSB mode decoder 37, which detects the first three bits of the mode control byte and develops a 3-bit VSB mode select signal. This signal identifies the VSB mode (M=24, 16, 8, 4 or 2) of the received symbols for controlling data acquisition circuit 34, slicer 36 and a symbol to byte converter 38 during the remainder of the respective frame. The remaining 5 bits of the mode control byte are used for error detection by VSB mode decoder 37. Slicer 36, which includes a nine line output bus, is responsive to the VSB mode select signal for converting the binary signal, representing the symbol amplitudes, to their corresponding bit values. Thus, in the M=2 VSB mode, each binary symbol amplitude signal is converted to the corresponding 1-bit signal on one of the nine output lines, to the corresponding 2-bit signal on two of the output lines in the M=4 VSB mode, to the corresponding 3-bit signal on three of the output lines in the M=8 VSB mode and to the corresponding 4-bit signal on four of the output lines in the M=16 VSB mode. In the M=24 VSB mode, two successive symbols are converted to the corresponding 9-bit signal (on all nine output lines) at one-half the symbol clock rate.

The nine-line output of slicer 36, together with the 3-bit VSB mode select signal from decoder 37 and the timing signals from data acquisition circuit 34 are coupled to symbol to byte converter 38, which is claimed in copending application Ser. No. 175,070, above, the output of which supplies a deinterleaver 40 that, in turn, supplies an RS decoder 42. Symbol to byte converter 38 converts the input bits representing the received symbols into a series of 8-bit data bytes for each of the VSB modes. Deinterleaver 40 deinterleaves the convolutionally interleaved data bytes supplied by converter 38 and RS decoder 42 performs error correction on the deinterleaved data bytes.

Figure 6:
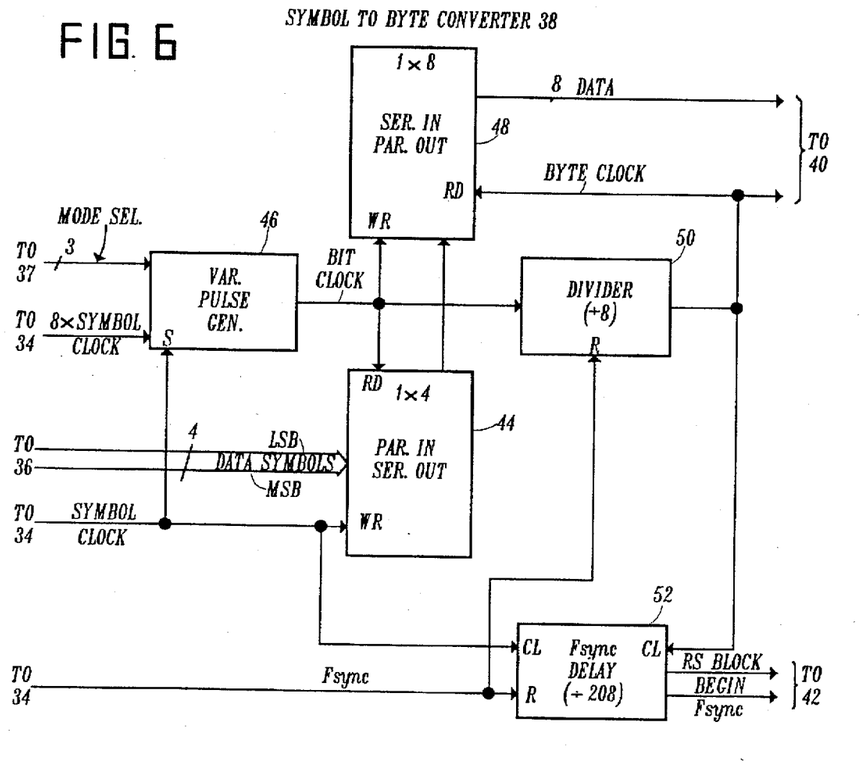
FIG. 6 is a more detailed showing of the symbol to byte converter of the data processor of FIG. 5.

Symbol to byte converter 38 is shown in more detail in FIG. 6. The 9-line data symbol bus from slicer 36 and the symbol clock signal from data acquisition circuit 34 are applied to a 1×9 parallel-in, serial-out register 44. The 3-bit VSB mode signal, the symbol clock signal and the 8 times symbol clock signal are applied to the inputs of a variable pulse generator 46. Generator 46 produces a series of pulses (bit clocks) at the 8 times symbol clock rate in response to each received symbol clock, the series including one pulse for VSB mode M=2, two pulses for VSB mode M=4, 3 pulses for VSB mode M=8, and 4 pulses for VSB mode M=16. A series of 9 pulses are sent for VSB mode M=24, while the symbol clock is halved.

Assuming, for example, VSB mode M=8, the 3 bits from slicer 36 (representing a received symbol) are simultaneously written into the top three locations of register 44 in response to a symbol clock. At the same time, the symbol clock starts pulse generator 46 which produces 3 bit clocks (at 8 times the symbol clock rate) which are applied to the Read (RD) input of register 44, to the Write (WR) input of a 1×8 Serial-in, Parallel-out register 48 and to the input of a divide-by-eight circuit divider 50. Divider 50 is reset at the beginning of each data frame 10 by FSYNC for synchronizing converter 38 with the received data, since FSYNC always represents a byte boundary. The 3 bits previously loaded into register 44 are serially read out of register 44 in response to the 3 bit clock pulses and written into register 48. The next 3-bit symbol from slicer 36 is processed in the same manner, resulting in 6 bits being stored in register 48. After the first two bits of the next (i.e. third) 3-bit symbol are written into register 48 from register 44, divider 50 generates an output (Byte Clock) causing the accumulated 8-bit data byte stored in register 48 to be read out (in parallel). The remaining single bit of the third symbol is stored in register 48 and read out with the next 7 bits of the succeeding 3-bit symbol as the next data byte. In this manner, converter 38 arranges the input 3-bit symbols (for M=8) into a series of successive 8-bit output data bytes, which are supplied to deinterleaver 40 at the rate of the byte clock.

A substantially similar procedure is carried out for VSB modes M=2, 4 and 16 except that, depending on the VSB mode, it will take a longer or shorter time period to compose the data bytes. For example, in VSB modes M=2 and 4, the bit clock generated by pulse generator 46 in response to each symbol clock signal comprises one and two pulses respectively, so that 8 and 4 symbol clock signals are required to produce the respective data bytes (versus 2⅔ for VSB mode M=8).

For VSB mode M=24, slicer 36 combines two 4.5 bit symbols into 9 bits at one-half the symbol clock rate and applies these signals to converter 38. Consequently, in response to each symbol clock, 9 bits from slicer 36 are loaded into register 44. Then, the 9 bits are serially read out of register 44 and written into register 48. However, after the 8th such bit has been written into the register, a Byte Clock output is generated by divider 50, reading these 8 bits out of register 48 as a data byte. The remaining bit will be read out of register 48 with the first 7 bits of the next symbol as the next data byte two symbol times later.

Converter 38 further includes a divider 52 which is also reset by FSYNC to synchronize its operation with the beginning of each data frame 10. In particular, divider 52 is a divide-by-207 counter which is clocked by the Byte Clock generated by divider 50 to generate a Begin RS Block signal for identifying the beginning of each block of 207 data bytes synchronously with the first data byte of each data frame. As will be explained hereinafter, this signal is used to synchronize the operation of RS decoder 42. Divider 52 includes means responsive to the symbol and byte clocks for converting the one-symbol-wide input FSYNC to a byte wide output FSYNC.

As described earlier, the outputs of converter 38 are applied to deinterleaver 40. As will be explained in further detail hereinafter, deinterleaver 40 deinterleaves the convolutionally interleaved data bytes received from converter 38 using a minimum of memory.

As is well known, interleaving is done at the transmitter (see interleaver 13 of FIG. 3) to spread contiguous data bytes apart from each other to help immunize the transmitted data from burst noise. In the receiver, the interleaved bytes must be deinterleaved to re-establish their original relationship prior to forward error correction. Thus, burst noise of some given time duration will corrupt only a limited number of bytes within an RS block of the deinterleaved data, which corrupted bytes can be corrected by the RS decoder. The interleaving algorithm used is selected in anticipation of the maximum expected burst noise duration at the fastest byte clock rate (i.e. corresponding to VSB mode M=24) to insure that the RS decoder is capable of error correcting the corrupted deinterleaved data bytes. Thus, as maximum expected burst noise duration increases, the interleaving algorithm must spread contiguous data bytes farther apart. Alternatively, a more powerful RS code may be used, but this approach has the disadvantage of using more overhead, i.e. requiring more bytes for error correction. Also, by referencing the system to the highest byte clock rate (corresponding to 24 VSB), increased burst error protection will be provided as the VSB mode and the corresponding byte rate decrease, because the interleave pattern is effected over a given number of bytes regardless of VSB mode.

Convolutional interleave algorithms are commonly used to immunize transmitted data from burst noise. Such algorithms delay the individual bytes of successive groups of bytes, sometimes referred to as the interleave depth, by different amounts to effectively scatter the bytes over a portion or all of the data frame. Deinterleaving is effected by delaying the received bytes by opposite amounts. In implementing such a system, three parameters are of particular significance; the maximum expected burst length BL, the number of byte errors T which the RS decoder can correct and the RS block size. As mentioned previously, there preferably are an integral number of RS blocks in the data frame so that the RS decoder can be synchronized by the frame sync signal FSYNC. By selecting an interleave group size (of which there are preferably an integral number in each frame) equal to a parameter B=BL/T and the different delays as integral multiples of a parameter N equal to or greater than the RS block size, the RS decoder will be able to correct the deinterleaved data for burst noise up to the maximum expected duration of BL byte clocks.

Consider the simplified example of a system in which the maximum expected burst length is 4 data byte clocks and the RS decoder is capable of correcting one data byte error in each 8 data byte RS block (i.e. BL=4, T=1, N=8). Using these parameters, the interleave group size B=BL/T=4/1=4. Convolutional interleaving is performed using these parameters such that for each group of B=4 data bytes, the first data byte is exposed to a delay of 0, the second to a delay of 1N=8 data byte clocks, the third to a delay of 2N=16 data byte clocks and the fourth to a delay of 3N=24 data byte clocks. Deinterleaving is effected by reversing the delays such that for each group of B=4 received interleaved data bytes, the first is delayed by 3N=24 data byte clocks, the second by 2N=16 data byte clocks, the third by 1N=8 data byte clocks and the fourth by 0.

Conventional convolutional deinterleavers implementing the above algorithm comprise a memory having (B−1)N/2 memory locations. For realistic values of B and N, which are typically much larger than the values used in the simplified example given above, this leads to a very complex architecture because of the large number of shift registers required. An alternate architecture which may be employed uses a standard linear memory array for which a large number of fifo head and tail pointers must be maintained in hardware. This is a very complex task and thus highly undesirable.

These problems are solved according to this invention by using a linear memory array with an address generator for generating a repeating sequence of read-write addresses that results in correctly deinterleaving the received data. The memory array is of a relatively small size utilizing only one memory location in excess of the number required to impose the different delays on the respective data bytes of each group. This invention is described below in relation to the simplified example given above and is extended to implementations using more realistic parameters.

More specifically, it has been discovered that a linear memory array having [(B−1)N/2]+1 memory locations may be addressed by a particular sequence of read-write addresses to correctly deinterleave a convolutionally interleaved data stream. The sequence of addresses is developed by first writing a column of [(B−1)N/2]+1 consecutive integers beginning with 0. This is represented by the first column of the addressing matrix of FIG. 7, which is for the simplified example with B=4 and N=8. Next a second column that is the same as the first is written except that it is rotated down by (B−1)N/B=(3×2)=6 rows. This is the second column in the matrix of FIG. 7. The third column is developed by rotating the second column down by (B−2)N/B=(2×2)=4 rows and, finally, the fourth and last column is developed by rotating the third column down by (B−3)N/B=(1×2)=2 rows. This matrix has a size of B=4 columns and [(B−1)N/2]+1=13 rows, the number of rows being the required size of the deinterleave linear memory array. If the numbers in the matrix are read out a row at a time, they can be used as read-write addresses for application to the deinterleave memory to continuously deinterleave the received data, i.e. read out the old data at the addressed memory location and write in the new data at the same location.

Figure 7:
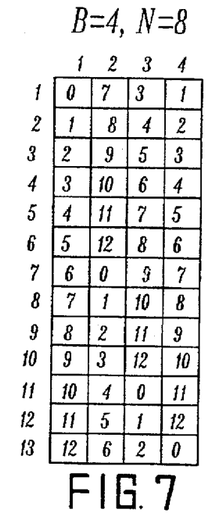
FIG. 7 is a diagram of an exemplary matrix of address signals for deinterleaving a convolutionally interleaved data stream according to the invention.
Figure 8:
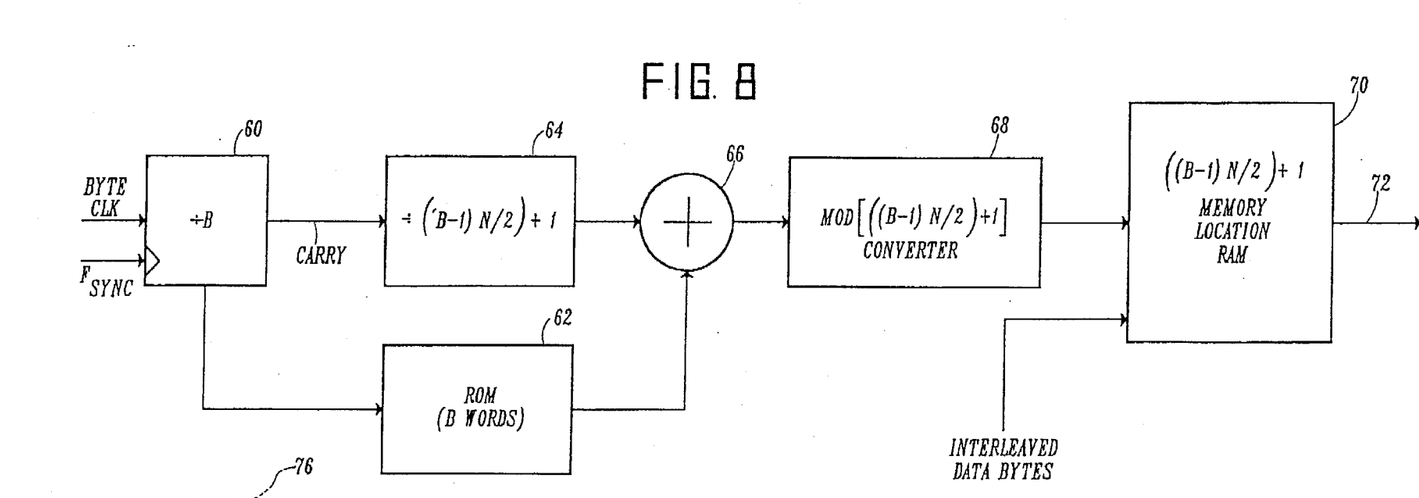
FIG. 8 is a generalized circuit operable for generating memory address signals, including those illustrated in FIG. 7.

A circuit for generating the address matrix of FIG. 7 is illustrated in FIG. 8. A divide by B up-counter 60, which is reset to zero by FSYNC, is responsive to the byte clock from converter 38 for applying a repeating sequence of counts from a minimum number to a maximum number, e.g. from 0 to (B−1), for addressing a B word ROM 62 at the byte clock rate. ROM 62 stores the B words comprising the first row of the address matrix. The carry output of divider 60 is used to clock a second divider 64 at the slower rate of byte clock/B, the division ratio of divider 64 being [(B−1)N/2]+1. The outputs of divider 64 and ROM 62 are summed in an adder 66 and applied through a modulo [(B−1)N/2]+1 converter 68 for addressing a linear deinterleave memory array 70 having [(B−1)N/2]+1 memory locations. Converter 68 preferably comprises a circuit which either couples its input signal to its output or, if the input is greater than [(B−1)N/2]+1, subtracts this value from the input signal before coupling it to its output.

For the simplified example described above, i.e. B=4 and N=8, divider 60 (÷4) repetitively generates the output count sequence 0, 1, 2, 3 for addressing and reading the four words 0, 7, 3, 1 stored in ROM 62 at the byte clock rate. Divider 64 (÷13) repetitively generates the output sequence 0, 1, 2 . . . 12 at ¼ the byte clock rate. Consequently, for each group of 4 successive byte clocks, the four words 0, 7, 3, 1 read from ROM 62 are each added to the output of divider 64 in adder 66 to produce, after processing by modulo 13 converter 68, a row of the address matrix of FIG. 7. For example, the first row 0, 7, 3, 1 of the matrix is produced during the first four byte clocks wherein O (from divider 64) is added to the outputs 0, 7, 3, 1 of ROM 62. During the next 4 byte clocks the value 1 (from divider 64) is added to the words 0, 7, 3, 1 generated by ROM 62 to produce the second row 1, 8, 4, 2 of the address matrix and so on until finally the last row is generated by adding 12 to each of the 4 words 0, 7, 3, 1 to produce the last row 12, 6 (=19 modulo 13, 2 (=15 modulo 13), 0 (=0 modulo 13).

Each address signal generated at the output of modulo 13 converter 68 initiates a read-write operation of RAM 70. That is, each address first causes the data byte stored at the addressed memory location to be read out on bus 72 and then the new interleaved data byte to be written into the same memory location. By following the addressing scheme disclosed herein, the data bytes read from RAM 70 will be in the correct deinterleaved format. The fact that the input data bytes are correctly deinterleaved can be seen from a close examination of the matrix of FIG. 7. In particular, it will be recalled that convolutional interleaving is effected for each group of four data bytes by delaying the first data byte by 0, the second data byte by 8 byte clocks, the third data byte by 16 byte clocks and the fourth data byte by 24 byte clocks. Theoretically, deinterleaving is then effected by delaying the first received data byte by 24 byte clocks, the second received data byte by 16 byte clocks, the third received data byte by 8 byte clocks and the fourth received data byte by 0 byte clocks. Adding a one byte clock delay to each received data byte will not affect the deinterleaving process so that delays of 25, 17, 9, 1 data clocks are equivalent to using deinterleaving delays of 24, 16, 8, 0 data clocks. Referring to the matrix of FIG. 7, the first received data byte is written into memory location 0 of RAM 70 and read out 25 byte clocks later at column 2, row 7 (i.e. after a delay of 25 byte clocks), the second is written into memory location 7 and read out 17 byte clocks later at column 3, row 5, (i.e. after a delay of 17 byte clocks), the third is written into memory location 3 and read out 9 byte clocks later at column 4, row 3 (i.e. after a delay of 9 byte clocks) and the fourth is written into memory location 1 from which it is read out 1 byte clock later at column 1, row 2 (i.e. after a delay of 1 byte clock). It will be apparent from this analysis that the deinterleaving algorithm is correctly executed.

In an embodiment of the invention actually being constructed for use in a cable television system the following parameters were selected: BL=260 bytes, T=10 and N=208. Therefore, B=BL/T=26 bytes, which is integrally related to the frame size for all VSB modes. For this case divider 60 of the circuit of FIG. 8 is a divide-by-26 divider (periodically reset by FSYNC) which sequentially address the 26 words of ROM 62 comprising the first row of the address matrix (0, 2401, . . . 1) shown in FIG. 9. Divider 64 is a divide by 2601 divider and converter 68 is a modulo 2601 converter. Operation of this embodiment of the circuit is identical to that described for the simplified example.

Figure 10:
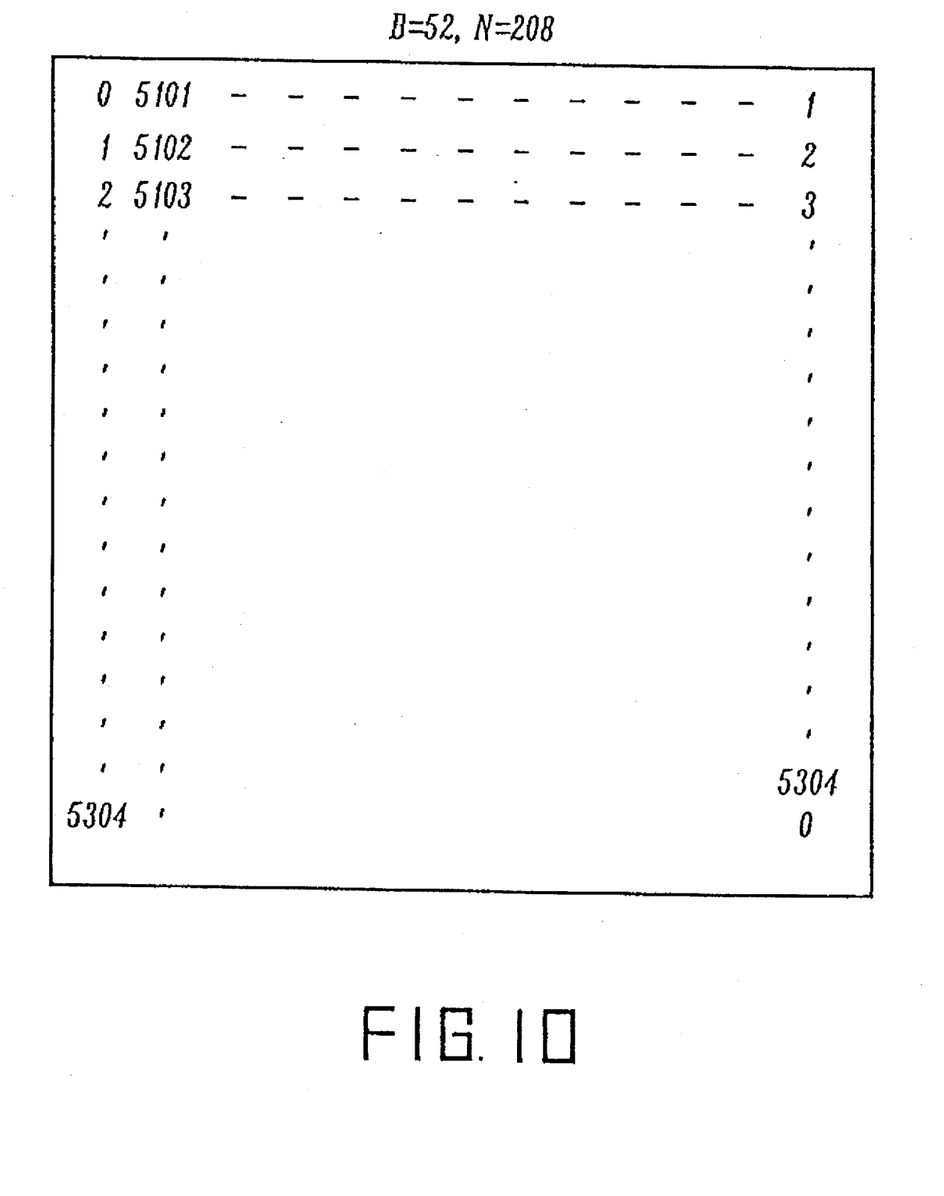
FIG. 10 is another deinterleave address signal matrix suitable for use in an embodiment of the invention.

As previously mentioned, the system parameters may have values other than those given above. For example, in a terrestial application it may be desirable to increase the interleave depth B since a larger maximum burst noise length is to be expected. Thus, in a terrestial application the following parameters may be used: BL=520 bytes, T=10 and N=208. Therefore B=BL/T=52. The address matrix for these parameters (B=52 and N=208) is shown in FIG. 10. The circuit of FIG. 8 may also be used for generating the address matrix of FIG. 10 by substituting the appropriate values of B and N in the various circuit elements.

Figure 9:
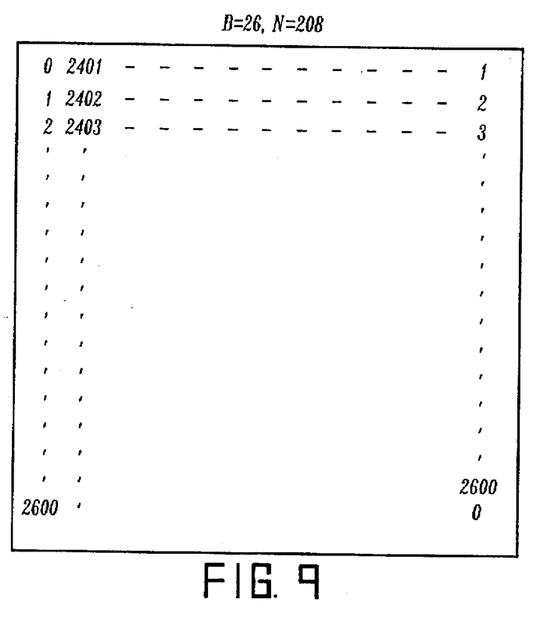
FIG. 9 is a deinterleave address signal matrix suitable for use in an actual embodiment of the invention.
Figure 11:
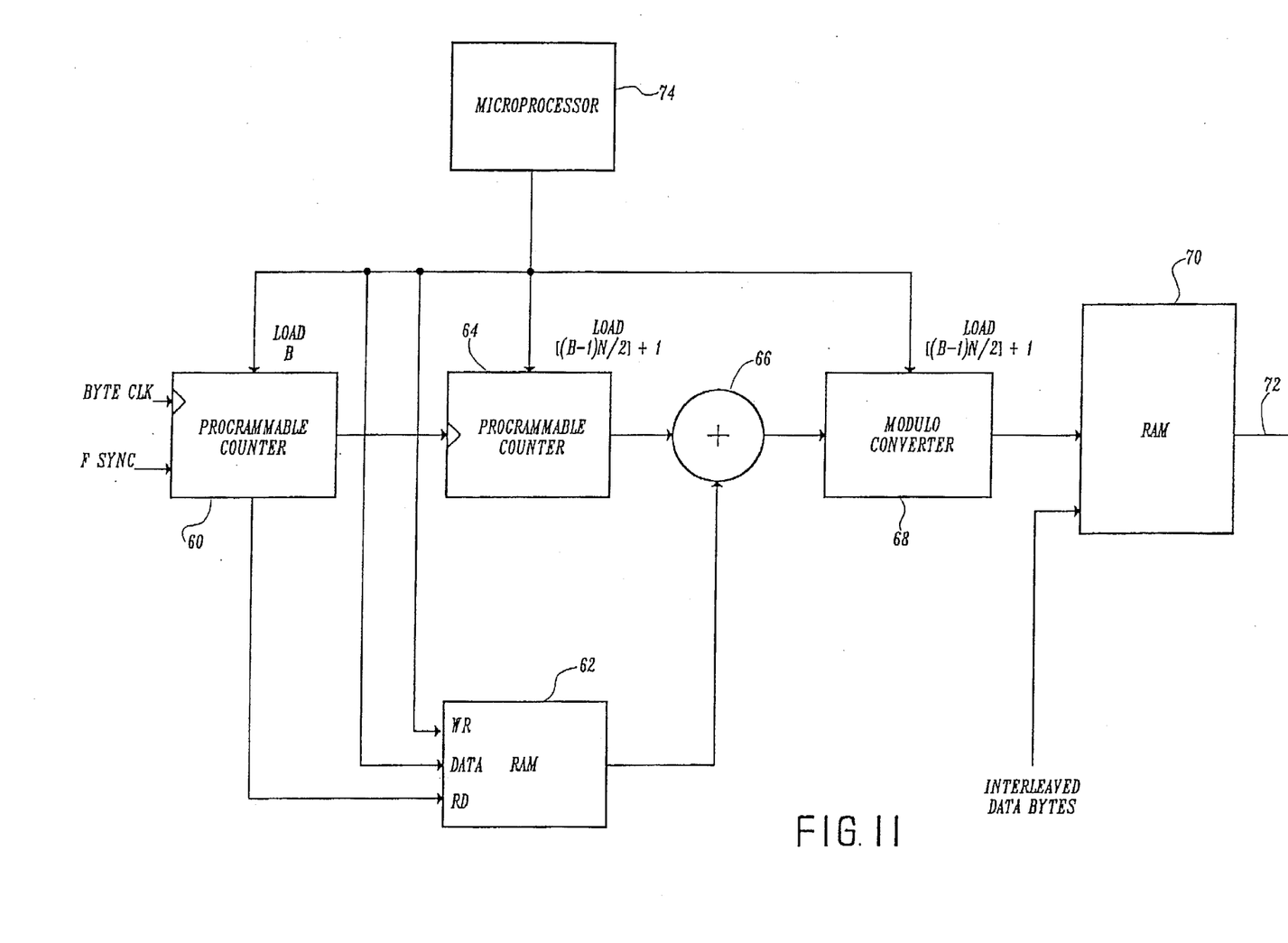
FIG. 11 is a programmable embodiment of the circuit of FIG. 8.

It may also be desirable to provide the circuit of FIG. 8 in a programmable form for selectively generating either the address matrix of FIG. 9 or the address matrix of FIG. 10. Such a circuit is shown in FIG. 11 wherein a microprocessor 74 is used at initialization to program counters 60 and 64 and modulo converter 68 with the appropriate values of B and N. Also, microprocessor 74 initializes memory 62 by loading the first row of addresses from either the matrix of FIG. 9 or FIG. 10. Thus, the circuit may be selectively operated in a first mode (B=26, N=208) by loading the value 26 into counter 60, the value 2601 into counter 64 and modulo converter 68 and by writing the first row of addresses form the matrix of FIG. 9 into memory 62. The circuit may be operated in a second mode to provide a larger interleave depth (B=52, N=208) by loading the value 52 into counter 60, the value 5305 into counter 64 and modulo converter 68 and by writing the first row of addresses from the matrix of FIG. 10 into memory 62. It will be understood that once programmed the circuit will operate as previously explained in connection with FIG. 8.

It will be noted that the circuits of FIGS. 8 and 11 automatically adapt to the different received VSB modes.

The circuits simply operate at an increased or decreased rate in response to the byte clock as the VSB mode varies. The deinterleaved data on bus 72, together with the FSYNC and Begin RS Block signals from converter 38 are applied to RS decoder 42 which error corrects the deinterleaved data bytes. Operation of RS decoder 42 is facilitated by synchronization with FSYNC at the beginning of each data frame and by providing an integral number of RS blocks each frame regardless of the VSB mode as previously explained.

Figure 12:
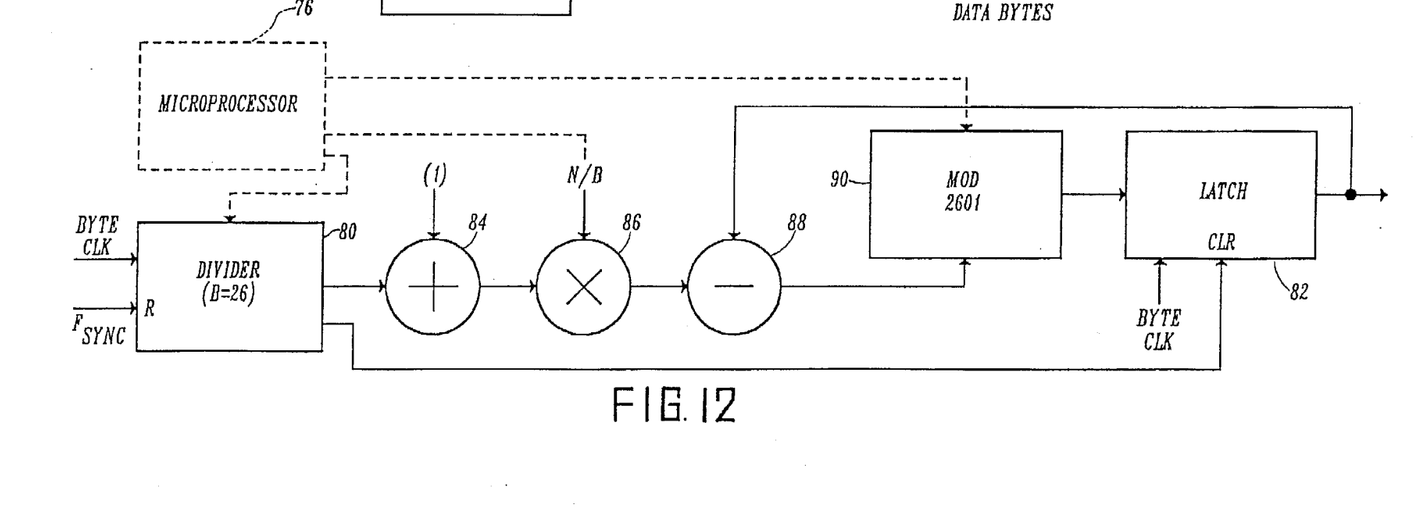
FIG. 12 is a replacement circuit for the ROM of FIG. 8 or the RAM of FIG. 11.

FIG. 12 shows a circuit which may be used in place of memory 62 of FIGS. 8 or 11 to generate the first row of matrix addresses. The circuit implements the following equations for generating the first row of addresses C (X):
$C(0)=0$
$C(X)=[C(X-1)-(B-X)N/B] \mod[(B-1)N/2+1]$,
where $X=1, \ldots (B-1)$.

For the simplified example (i.e. B=4 and N=8) the term $C(X)$ becomes $C(X)=[C(X-1)-(4-X)2]\mod 13$. Thus, for example, if $X=1$, $C(X)=(0-6)\mod 13=-6 \mod 13=7$. Similarly, for $X=2$, $C(X)=(7-4) \mod 13=3$. And finally, for $X=3$, $C(X)=(3-2) \mod 13=1$. The first row for the larger matrices of FIGS. 9 and 10 may likewise be derived using these relationships. Referring to FIG. 12, the circuit comprises an input divide by B count down divider 80 which is reset by FSYNC and clocked by the byte clock. In response to being reset, an output of divider 80 clears a latch 82. The output of divider 80 is provided in reverse order (B-1, B-2, ... 0) so that when it is incremented by one (1) in an adder 84, the result is (B-X). The variable (B-X) is multiplied by N/B in a multiplier 86 to provide the expression (B-X)N/B. Multiplier 86 may comprise a relatively simple bit-shifting circuit since, in both embodiments, the factor N/B is a power of two (i.e. $208/52=4$ and $208/26=8$). Expression (B-X) N/B is then subtracted from the output C(X-1) of latch 82 in subtractor 88 to provide C(X-1)-(B-X)N/B. Finally, the output of the subtractor is coupled by a modulo [(B-1)N/2]+1 circuit for temporary storage in latch 82 in response to a byte clock. As in the previous case, the circuit may be made programmable by providing a microprocessor 76 or other suitable controller for loading the appropriate divisor in divider 80, the value N/B into multiplier 86 and the value [(B-1)N/2]+1 into modulo converter 90 upon initialization.

Figure 13:
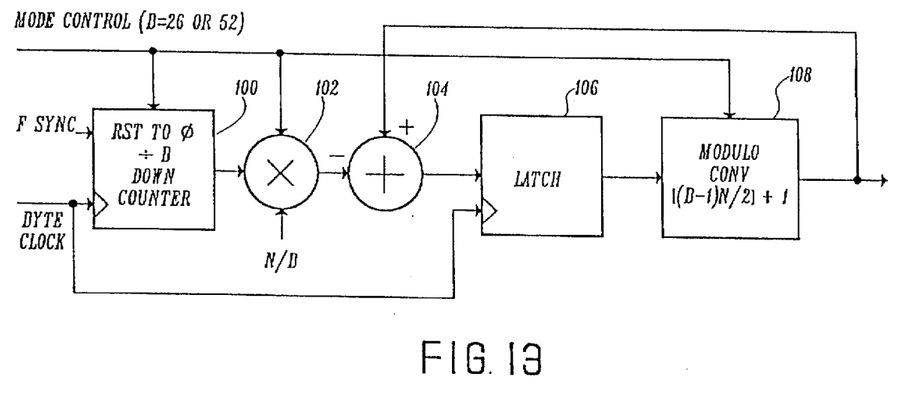
FIG. 13 is a block diagram showing an alternate embodiment of a convolutional deinterleaver.

FIG. 13 illustrates an alternate embodiment of the deinterleaver circuits of FIGS. 8 and 11. In this embodiment a divide-by-B down-counter 100 is reset to zero by FSYNC and clocked by the byte clock. The output of counter 100 supplies one input of a multiplier 102, whose other input is supplied with the value N/B. As in the case of multiplier 86 of FIG. 12, multiplier 102 preferably comprises a bit-shifter since for both modes B=26 and B=52 the value N/B comprises a power of two. The output of multiplier 102 is applied to the negative input of a subtracting circuit 104, the output of which is applied by a latch 106 to the input of a modulo [(B-1)N/2]+1 converter 108. The output of converter 108, which represents the address signal sequences applied to memory 70 (see FIG. 8), is coupled back to the positive input of subtractor 104. As in the previous embodiments, a B=26 or B=52 mode control signal may be applied to counter 100, multiplier 102 and converter 108 for effecting operation in either of the respective modes.

Considering the simplified example of B=4, N=8, assume that counter 100 has just been reset to zero and that the current output of converter 108 is zero. Consequently, a value of zero will be developed at the outputs of both multiplier 102 and subtractor 104 and applied by latch 106 for development at the output of converter 108. The output of counter 100 next increments to a value of 3 so that the output of multiplier 102 goes to 6 and the output of subtractor 104 to −6. The value −6 is coupled by latch 106 to converter 108 where it is converted to the value 7. The output of counter 100 next increments to a value of 2 causing the output of converter 108 to assume the value of [7−(2×2)] modulo 13=3. The next byte clock causes the output of counter 100 to increment to a value of 1 and the output of converter 108 to assume the value [3−(2×1)] mod 13=1. Referring to FIG. 7, it will be seen that these four consecutive outputs comprise the first row of the address signal matrix. It will be understood that the subsequent rows of the address signal matrix are generated in a like manner and, when used to address the linear memory 70 as previously described, properly deinterleave the received convolutionally interleaved data bytes.

Figure 14:
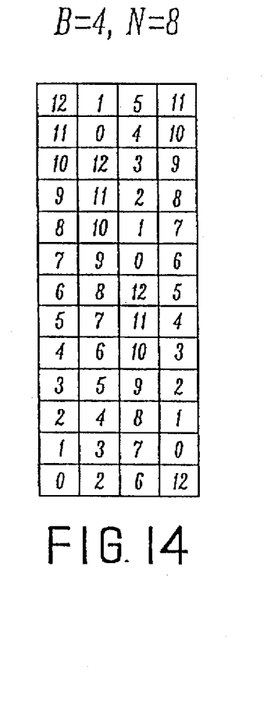
FIGS. 14, 15 and 16 are diagrams of respective convolutional interleave address signal matrices.

While the previous discussion has largely focused on the implementation of convolutional deinterleavers according to the invention, it will be understood that essentially the same techniques can be applied to the design and construction of convolutional interleavers. In particular, in order to provide a convolutional interleaver according to the invention it is only necessary to reverse the order of the address signal sequence represented by the matrices of FIGS. 7, 9 and 10 and to make some relatively minor circuit changes. The reversed order addressing matrix for the simplified case of B=4 and N=8 is shown in FIG. 14. The first column of the matrix is developed by writing a column of [(B-1)N/2]+1= 13 consecutive integers beginning with 12 and ending with 0. The second column comprises the first column rotated down by (B-3)N/B=(1×2)=2 rows, the third column comprises the second column rotated down by (B-2)N/B=2×2) =4 rows, and the fourth column comprises the third column rotated down by (B-1)N/B=(3×2)=6 rows. Similar interleave address signal matrices may be developed for the cases of B=26, N=208 and B=52, N=208, and these are shown in FIGS. 15 and 16 respectively.

Figure 15:
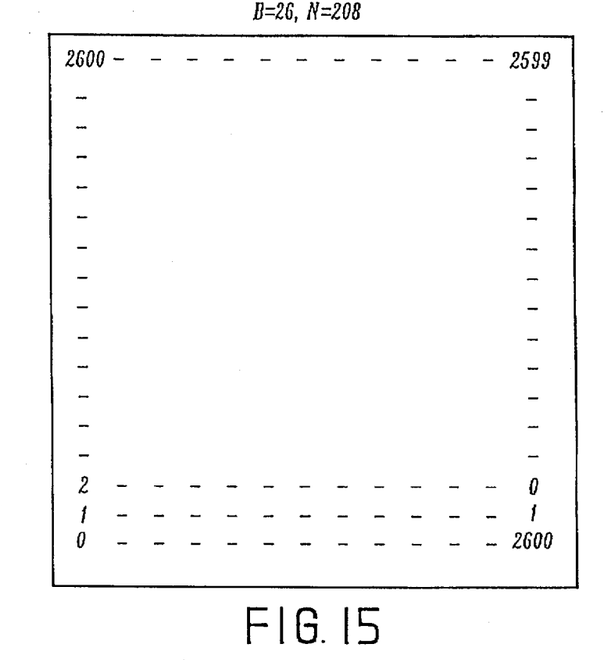
Figure 16:
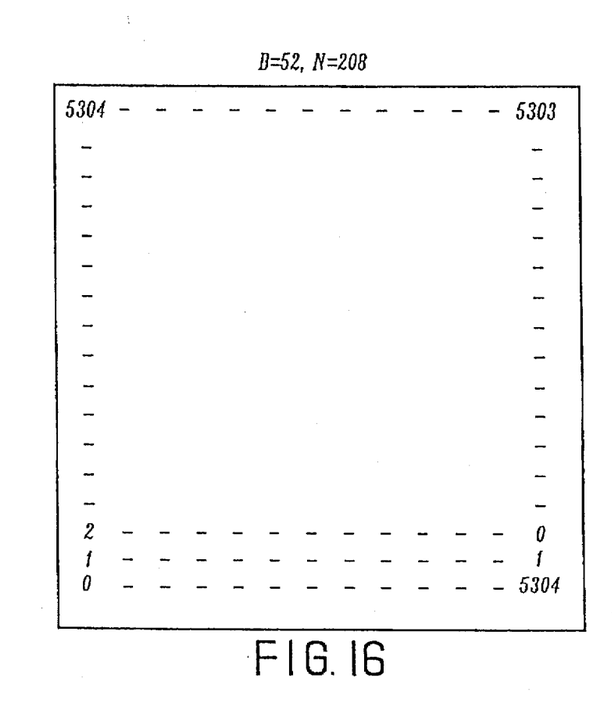

The circuits of FIGS. 8 and 11 may be made to operate in an interleave mode by configuring counter 60 as a down-counter and by storing the last row of the respective address signal matrix of FIG. 14, 15 or 16 in memory 62. With these changes, the output 72 of memory 70 will comprise the desired convolutionally interleaved data stream.

Figure 17:
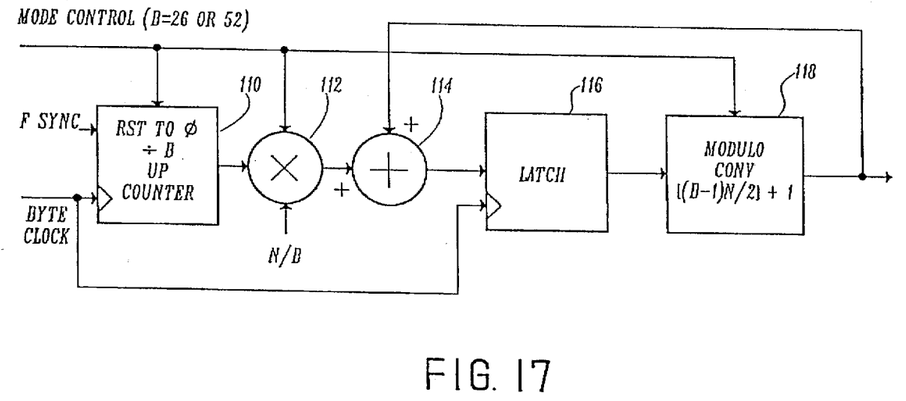
FIG. 17 is a block diagram showing an alternate embodiment of a convolutional interleaver.

An alternate interleaver embodiment, similar to the deinterleaver embodiment of FIG. 13, is shown in FIG. 17. In this embodiment a divide-by-B up-counter 110 is reset to zero by FSYNC and clocked by the byte clock. The output of counter 110 supplies one input of a multiplier 112, whose other input is supplied with the value N/B. As in the previous embodiments, multiplier 112 preferably comprises a bit-shifter since for both modes B=26 and B=52 the value of N/B comprises a power of two (i.e. $208/26=8$ and $208/52=4$). The output of multiplier 112 is applied to one input of an adder 114, the output of which is applied by a latch 116 to the input of a modulo [(B-1)N/2]+1 converter 118. The output of converter 118, which represents the address signal sequences applied to memory 70, is coupled back to the second input of adder 114. A B=26 or B=52 mode control signal may be applied to counter 110, multiplier 112 and converter 118 for effecting operation in either of the respective modes.

Considering again the simplified example of B=4, N=8, and assuming that the current output of converter 118 is 0, the address signal matrix of FIG. 14 is generated by the circuit of FIG. 17 as follows. Counter 110 will produce successive outputs of 0, 1, 2, 3, 0, 1, 2, 3 . . . in response to the byte clock. Multiplier 112 will therefore produce the corresponding outputs 0, 2, 4, 6, 0, 2, 4, 6 . . . The corresponding outputs of adder 114 and latch 116 are therefore 0(0+0), 2(2+0), 6(4+2), 12(6+6), 12(0+12), 14(2+12), 5(4+1), 11(6+5)... and the outputs of converter 118 are 0, 2, 6, 12, 12, 1 (14 modulo 13), 5, 11 ... It will be seen that the latter outputs comprise the last and first rows respectively of the address signal matrix of FIG. 14 and that the remaining rows will be generated in a like manner. The output of converter 118, when used to address a memory such as linear memory 70 will therefore properly interleave the data bytes prior to transmission.

The following claims are directed to the aspect of the invention involving data frame format, including the use of such formats for variable size data constellations. It will be appreciated that the invention is limited only as defined in the claims.

What is claimed is:

1. A method of formatting a data frame of multilevel symbols conforming to any one of a plurality of different size data constellations, comprising:

establishing a plurality of repetitive data segments, each containing a fixed number of symbols representing a plurality of data bytes and a data segment sync character;

incorporating a header, including a frame sync code and a mode code identifying one of said data constellations from which the symbols of the data frame are derived, in one of said data segments; and establishing error correction blocks and overall frame size to produce an integral number of error correction blocks and data bytes in the frame.

2. The method of claim 1 wherein there are 832 symbols per data segment, 4 of each of said 832 symbols comprising said data segment sync character, 313 data segments per frame and 207 data bytes per error correction block.

3. The method of claim 1 wherein said header constitutes the first data segment and wherein said frame sync code and said mode code comprise two level symbols.

4. The method of claim 3 wherein said data is convolutionally interleaved in groups of size N, and wherein there are an integral number of said groups in each frame regardless of the value of M.

5. The method of claim 3 wherein said error correction blocks utilize a Reed-Solomon error correction algorithm and wherein said data constellations comprise M level symbols where M may be equal to at least 2, 4, 8 or 16.

6. The method of claim 3 wherein said error correction blocks utilize a Reed-Solomon error correction algorithm and wherein said data constellations comprise M level symbols where M may be equal to 24.

7. A repetitive data frame structure of multilevel symbols comprising:

a plurality of data segments each including a fixed number of M level symbols representing a plurality of data bytes and a data segment sync character, said data bytes forming a plurality of successive error correction blocks each comprising a predetermined number of said data bytes; and the numbers of symbols per data segment, data segments per frame and data bytes per error correction block being selected such that for each of a selected plurality of values of M, the frame includes an integral number of data bytes and an integral number of error correction blocks.

8. The data frame of claim 7 wherein said data frame structure further comprises a header segment including a frame sync code and a mode code identifying the value of M for the frame.

9. The data frame of claim 8 wherein said data frame comprises 312 data segments and said one header segment, wherein each of said data and header segments comprises 832 symbols, 4 of which comprise said data segment sync character, and wherein each of said error correction blocks comprise 207 data bytes.

10. The date frame of claim 9 wherein M is equal to 24.

11. The data frame of claim 9 wherein M is equal to 2, 4, 8 or 16.

12. The data frame of claim 11 wherein said data segment sync character, said frame sync code and said mode code are all two level symbols.

13. The data frame of claim 12 wherein said data is convolutionally interleaved.

14. A method of formatting a data frame comprising:

providing a given number DS of repetitive data segments, each of said data segments containing a fixed number S of M-level symbols representing a plurality of data bytes and a data segment sync character, said data bytes being arranged in a plurality of successive error correction blocks of RS data bytes and in a plurality of successive groups of B convolutionally interleaved data bytes; and choosing RS, B, M, S and DS such that said data frame comprises an integral number of said error correction blocks, said interleave groups and said data bytes.

15. The method of claim 14 wherein M comprises one of a selected plurality of integer values.

16. The method of claim 15 wherein said data frame further comprises a header segment including a constellation size code defining the chosen value of M for said frame and a frame sync code.

17. The method of claim 16 wherein said data frame comprises 312 data segments and said one header segment and wherein each of said data and header segments comprise 832 symbols, 4 of which represent said data segment sync character.

18. The method of claim 16 wherein said header segment constitutes the first segment of said frame and wherein said frame sync code and said constellation size code comprises two level symbols.

19. The method of claim 18 wherein said plurality of integer values comprise at least 2, 4, 8 and 16.

20. The method of claim 19 wherein said plurality of integer values further includes 24.

21. A data receiver comprising:

means for receiving an information signal comprising a plurality of repetitive frames each comprising a given number DS of repetitive data segments, each of said data segments comprising a fixed number 8 of M-level symbols representing a plurality of data bytes and a data segment sync character, said data bytes being arranged in a plurality of successive error correction blocks of RS data bytes and in a plurality of successive groups of B convolutionally interleaved data bytes; RS, B, DS, S and M being related such that each of said data frames comprises an integral number of said error correction blocks, said interleave groups and said data bytes;

means for detecting and quantizing said received information signal; and means for processing said detected and quantized information signal.

22. The receiver of claim 21 including means responsive to said information signal for generating a reset signal at the beginning of each of said frames, said processing means being reset at the beginning of each of said frames in response to said reset signal.

23. The receiver of claim 22 wherein said processing means comprises a forward error correction circuit for error correcting said error correction blocks and which is reset at the beginning of each of said frames in response to said reset signal.

24. The receiver of claim 22 wherein said processing means comprises a convolutional deinterleaver for convolutionally deinterleaving said groups of convolutionally interleaved data bytes, said convolutional deinterleaver being reset at the beginning of each of said frames in response to said reset signal.

25. The receiver of claim 21 wherein M comprises one of a selected plurality of integer values.

26. The receiver of claim 25 wherein said plurality of integer values comprise at least 2, 4, 8 and 16.

27. The receiver of claim 26 wherein said plurality of integer values further includes 24.

28. The receiver of claim 21 wherein each of said frames further comprises a header segment including a constellation size code defining the chosen value of M for said frame and a frame sync code.

29. The receiver of claim 28 wherein said header segment constitutes the first segment of said frame and wherein said frame sync code and said constellation size code comprise two level symbols.

30. The receiver of claim 28 wherein said frame comprises 312 data segments and said one header segment and wherein each of said data and header segments comprises 832 symbols, 4 of which represent said data segment sync character.

* * * * *

UNITED STATES PATENT AND TRADEMARK OFFICE
CERTIFICATE OF CORRECTION

PATENT NO. : 5,677,911
DATED      : October 14, 1997
INVENTOR(S) : Fimoff and Laud It is certified that error appears in the above-indentified patent and that said Letters Patent is hereby corrected as shown below:

In claim 21, line 5, delete "8" and substitute therefore -- S --.

Signed and Sealed this

Twenty-sixth Day of January, 1999

Attest:

Attesting Officer

*Acting Commissioner of Patents and Trademarks*